United States Patent

Givens et al.

[11] Patent Number: 5,959,452
[45] Date of Patent: Sep. 28, 1999

[54] LORENTZ FORCE MAGNETOMETER HAVING A RESONATOR

[75] Inventors: Robert B. Givens, Silver Spring; John C. Murphy, Clarksville; Dennis K. Wickenden, Woodbine; Robert Osiander, Ellicott City; Thomas J. Kistenmacher, Baltimore, all of Md.

[73] Assignee: The Johns Hopkins University, Baltimore, Md.

[21] Appl. No.: 08/943,735

[22] Filed: Oct. 3, 1997

[51] Int. Cl.⁶ ............................................. G01R 33/02
[52] U.S. Cl. ............................................................ 324/260
[58] Field of Search ................................... 324/244, 260; 331/65, 96, 154, 155, 156, 157; 334/4

[56] References Cited

U.S. PATENT DOCUMENTS 2,759,102  8/1956  Burns, Jr. ................................... 331/96

Primary Examiner—Walter E. Snow
Attorney, Agent, or Firm—Francis A. Cooch

[57] ABSTRACT

The invention consists, in one embodiment, of a resonator such as a conductive bar supported by two wires placed at the nodal points of the fundamental resonance frequency. The wires also supply current of this frequency to the resonator. In the presence of a magnetic field, the Lorentz force causes the resonator to vibrate. The amplitude of this vibration is proportional to a vector component of the magnetic field. The motion of the resonator is detected using one of a number of possible methods including optical beam deflection. The invention has a sensitivity of at least 1 nT, comparable to that of a commercial fluxgate magnetometer, and a dynamic range exceeding 80 dB.

7 Claims, 2 Drawing Sheets

F = Lorentz force
I = current
B = applied magnetic field

LORENTZ FORCE MAGNETOMETER HAVING A RESONATOR

STATEMENT OF GOVERNMENTAL INTEREST

This invention was made with Government support under Contract No. N00039-95-C-0002 awarded by the Department of the Navy. The Government has certain rights in the invention.

BACKGROUND OF THE INVENTION

The invention relates to magnetometers or magnetic field sensors and, more specifically, comprises a simple, small, lightweight, low-cost, and low-power-consumption sensor that utilizes the Lorentz force to measure vector magnetic fields.

There is increasing interest in the development of miniature magnetometers for mapping magnetic fields in space and in industrial and environmental applications. The trend is constantly toward smaller size, lower power consumption, and lower cost for similar performance. Toward this end, recent developments have included the use of piezoresistive cantilevers (originally developed for atomic force and scanning tunneling microscopy) and $\mu$ magnetometers (based on electron tunneling effects).

The problem with the above devices is that they require, at least in some stages of their assembly, extensive and intricate processing. Furthermore, their sensitivities, defined as the minimum detectable field change, are generally in the range of 1 mT to 1 $\mu$T. Therefore, there remains a need for magnetometers with increased sensitivity in which size, power and cost are reduced.

SUMMARY OF THE INVENTION

The invention is a simple, small, lightweight, low-cost, and low-power-consumption sensor that utilizes the Lorentz force to measure vector magnetic fields. The invention, which in one embodiment is based on a classical xylophone resonator, is intrinsically linear and has a wide dynamic range such that it can measure magnetic fields over both the nanotesla and tesla regimes.

In one embodiment, the invention comprises a resonator such as a bar supported by two wires placed at the nodal points of the fundamental resonance frequency. The wires also supply current of this frequency to the resonator. In the presence of a magnetic field, the Lorentz force causes the resonator to vibrate. The amplitude of this vibration is proportional to a vector component of the magnetic field. The motion of the resonator is detected using one of a number of possible methods including optical beam deflection.

As noted above, the invention is intrinsically linear, and by altering the resonant drive current the sensitivity can range from nanoteslas to teslas. The principle of operation of the invention lends itself to miniaturization and to the development of high sensitivity, wide dynamic range magnetometers of considerable use in a variety of applications.

DETAILED DESCRIPTION OF THE INVENTION

The sensor of the invention measures, in one embodiment, the deflection in a conducting, doubly supported bar produced by the Lorentz force represented by the equation F=I×B where F is the Lorentz force, I a current and B the magnetic field. The bar is supported at nodes of fundamental resonance and is excited in one of its transverse resonant modes.

Figure 1:
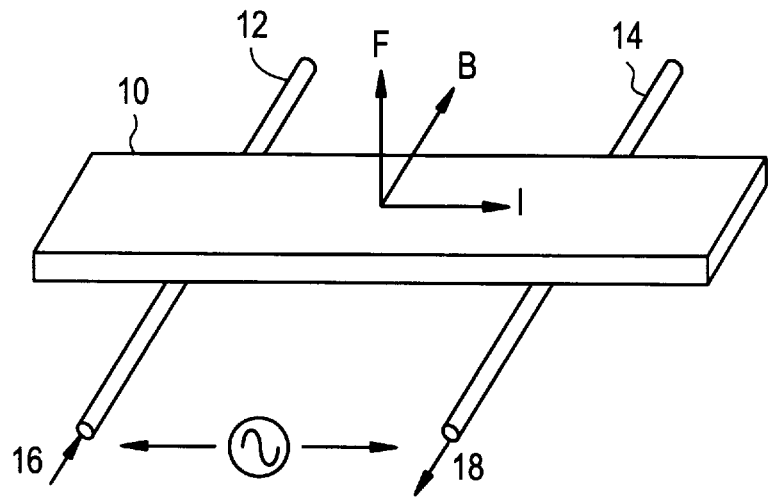
FIG. 1 is a schematic drawing of one embodiment of the magnetometer of the invention that also shows its principle of operation.

FIG. 1 shows one embodiment of the magnetometer of the invention. It consists of a resonator 10, in this case a thin conductive, e.g., aluminum, bar, supported by two support wires 12, 14. The wires are bonded to the bar to provide low-resistance electrical contacts, and positioned at the nodal points expected for a bar free at both ends and vibrating in its fundamental mode.

In operation, alternating currents, generated by a sinusoidal source oscillating at the fundamental transverse resonant mode, are supplied to the bar at one of two support nodes 16 and extracted at the other node 18, and the device is placed inside a set of Helmholtz coils. The Lorentz force generated by the current and the applied magnetic field (F=I×B) causes the bar (xylophone) to vibrate in its fundamental mode, the amplitude being proportional to the vector component of the field in the plane of the bar and parallel to the support wires.

The amplitude of the vibration can be measured using an optical beam deflection technique in which the deflection of a DC-driven diode laser beam is reflected from one of the free ends of the bar onto a position-sensitive detector (PSD). The difference in outputs is then fed to a lock-in amplifier whose reference signal is obtained from the xylophone resonator drive waveform. Other possible detection methods include interferometric measurement of displacement, rf and direct measurement of capacitance between the bar and an electrode placed near the bar, and measurement of tunneling currents. A fluxgate magnetometer can also be positioned in the Helmholtz coils to act as a calibration source.

Figure 2:
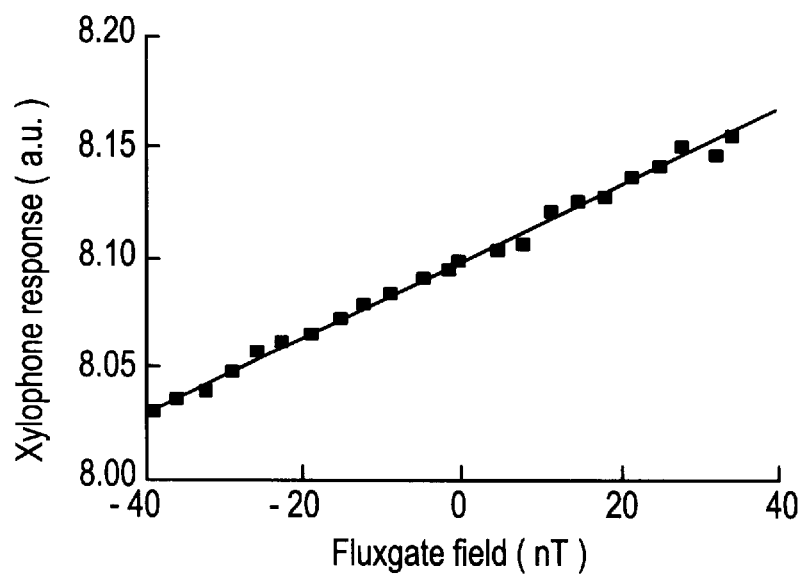
FIG. 2 is a plot of the output response of the magnetometer of FIG. 1, in arbitrary units, as a function of magnetic field.

A plot of the response of the xylophone magnetometer, as a function of magnetic field (as measured by the adjacent fluxgate magnetometer) over the range of ±40 nT, is shown in FIG. 2. The superimposed line is a linear fit to the data. The response is given in arbitrary units since it represents the output of the lock-in amplifier. It is apparent from the above results that the response of the xylophone embodiment of the invention is linear over this range and that its sensitivity is at least 1 nT and probably at least equal to that of the fluxgate magnetometer.

Figure 3:
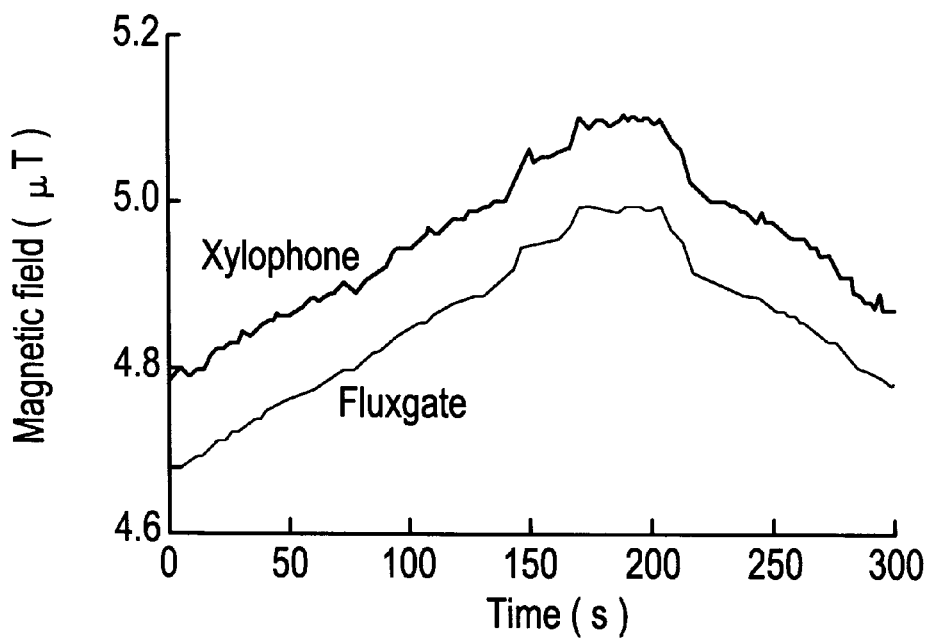
FIG. 3 is a plot comparing the temporal variation in output responses of the magnetometer of FIG. 1 and a fluxgate magnetometer.

The above action is even more dramatically illustrated in FIG. 3, which depicts the fields measured by the two magnetometers during the course of a data collection run. The short-range variations in signal levels of the two magnetometers track to a remarkable extent and are the result of small temporal variations in the local magnetic field, including those caused by the motion of magnetic objects in adjacent areas. These variations are also thought to cause the majority of the scatter observed in FIG. 2.

The fine detail in FIG. 3 is more pronounced for the xylophone trace, hinting at perhaps higher sensitivity and/or faster speed of response, although it is not known how much the output of the fluxgate has been smoothed by filtering. The similarity in signals of the two devices also points out that since no particular care was taken to mechanically isolate the setup, normal vibrations, away from the fundamental resonance frequency, do not appear to be a serious interference source for the xylophone resonator. The true sensitivity and noise floor of the invention can only be determined by repeating the measurements in a vibration-free environment with adequate magnetic shielding.

Figure 4:
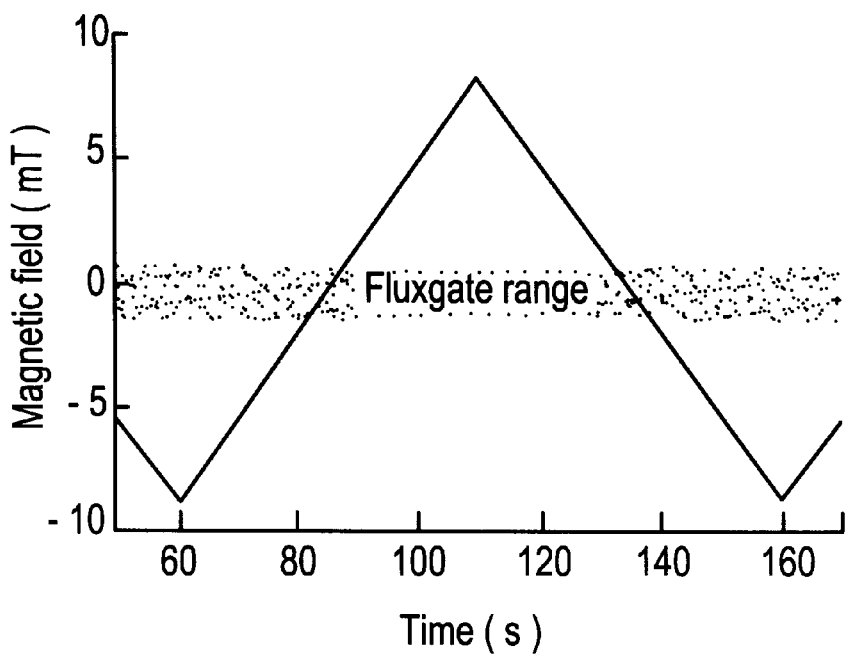
FIG. 4 is a plot of the output response of the magnetometer of FIG. 1 obtained by ramping the current through Helmholtz coils at an approximately linear rate and generating magnetic fields over the range ±8 mT.

An indication of the increased range of the xylophone magnetometer is obtained by ramping the current through the Helmholtz coils at an approximately linear rate and generating magnetic fields over the range ±8 mT. The results are given in FIG. 4 and demonstrate that the device remains linear over this complete range, a range limited only by the current-carrying capacity of the Helmholtz coils. For comparison purposes, the range of operation of the fluxgate magnetometer is also indicated. Note that the fluxgate range of ±0.1 mT is not zero-centered because of residual background fields in the laboratory.

The high sensitivity of the xylophone magnetometer is partly due to the high Q-factor of the structure. This increased only a little when operated in a helium atmosphere, indicating that little damping was occurring due to viscous drag.

The sensitivity can be increased still further by increasing the resonance-drive current. The resistance of the invention can be reduced still further by optimization of the wire-bonding process. The power dissipation, which is on the order of a few milliwatts, does not introduce any significant thermal problems.

In a similar manner, the operating range of the device can be substantially increased by reducing the resonance drive current. The sensitivity is directly proportional to the drive current and, therefore, by decreasing the current, the range of operation can be increased to at least 1 T. For a given drive current, the instantaneous dynamic range exceeds $10^4$ or 80 dB, a level set by the signal processing electronics used.

At present, the maximum bandwidth of the xylophone structure is only a few hertz. This bandwidth can be increased by positioning the nodal supports appropriately and driving the resonator at an overtone frequency. Alternatively, the fundamental frequency can be increased significantly by decreasing the dimensions of the structure since it is inversely proportional to the square of the length.

Several additional advantages will accrue in going to smaller structures. First, when monitoring ac magnetic fields, the contribution of the 1/$f$ noise will be reduced. Second, it should be readily possible to fabricate the resonators, together with integral supports, using conventional photolithography and/or microelectromechanical (MEMS)- or LIGA-processing (German acronym for LIthographie, Galvanoformung, Abformung) techniques.

Third, the availability of micromachined components will permit the development of compact, fully integrated systems using, for example, capacitive detection and standard signal processing techniques. Finally, it will become possible to fabricate arrays of sensors to allow for high-sensitivity magnetic imaging.

The invention offers a number of advantages for field applications: small size, high sensitivity, integration on a silicon chip, and vector capability. It can be fabricated using standard MEMS processing techniques into planar three-axis magnetometers and into one- or two-dimensional arrays for magnetic imaging applications.

The magnetometer of the invention currently is quite suitable for attitude determination and self-noise cancellation roles in space applications. The invention may also be useful in machinery monitoring and ship detection.

We claim:

1. A magnetometer comprising:
   a resonator containing first and second nodes of fundamental resonance; and
   first and second support wires supporting the resonator at the first and second nodes of fundamental resonance for inserting a current at the first node and extracting the current at the second node, the magnetometer being placed in a magnetic field to be detected, the magnetic field being normal to the direction of the current in the plane of the resonator and producing a Lorentz force normal to the resonator, the Lorentz force causing deflection in the resonator that can be detected.

2. The magnetometer as recited in claim 1, wherein the resonator is a bar.

3. The magnetometer as recited in claim 2, wherein the current inserted onto the bar is at the resonant frequency of the bar.

4. The magnetometer as recited in claim 1, further comprising a means for detecting the deflection of the resonator.

5. A method for detecting a vector magnetic field comprising the steps of:
   supporting a resonator at first and second nodes of fundamental resonance;
   inserting a current at the first node and extracting the current at the second node;
   placing the resonator in a magnetic field normal to the direction of the current in the plane of the resonator, thereby producing a Lorentz force normal to the resonator, the Lorentz force causing deflection in the resonator; and
   detecting the deflection in the resonator.

6. The method as recited in claim 5, wherein the resonator comprises a bar.

7. The method as recited in claim 6, wherein the current inserted onto the bar is at the resonant frequency of the bar.

* * * * *